(12) United States Patent
Yeh

(10) Patent No.: US 11,404,344 B2
(45) Date of Patent: Aug. 2, 2022

(54) HEAT SPREADING PLATE

(71) Applicant: Jentech Precision Industrial Co., LTD., Taoyuan (TW)

(72) Inventor: Chun-Ta Yeh, Taoyuan (TW)

(73) Assignee: Jentech Precision Industrial Co., LTD., Taoyuan (TW)

( * ) Notice: Subject to any disclaimer, the term of this patent is extended or adjusted under 35 U.S.C. 154(b) by 116 days.

(21) Appl. No.: 17/027,683

(22) Filed: Sep. 21, 2020

(65) Prior Publication Data

US 2021/0143077 A1 May 13, 2021

(30) Foreign Application Priority Data

Nov. 12, 2019 (TW) .................................. 108141048

(51) Int. Cl.
*H01L 23/367* (2006.01)
*H01L 23/373* (2006.01)
*H01L 25/065* (2006.01)
*H01L 25/10* (2006.01)
*H01L 23/495* (2006.01)

(52) U.S. Cl.
CPC ........ *H01L 23/367* (2013.01); *H01L 23/3736* (2013.01); *H01L 23/49575* (2013.01); *H01L 25/0655* (2013.01); *H01L 25/105* (2013.01)

(58) Field of Classification Search
CPC ............... H01L 23/367; H01L 23/3736; H01L 25/0655; H01L 2924/15311; H01L 2924/1615; H01L 2924/16251; H01L 21/4878; H01L 21/4882; H01L 23/3675; H01L 23/3672; H01L 23/49575; H01L 25/105
See application file for complete search history.

(56) References Cited

U.S. PATENT DOCUMENTS

2012/0061850 A1* 3/2012 Kuroda ................... H01L 24/29
438/118
2013/0100616 A1* 4/2013 Zohni ................... H01L 25/105
361/728

FOREIGN PATENT DOCUMENTS

| TW | 200849513 A | 12/2008 |
| TW | 201125094 A | 7/2011 |
| TW | 201423954 A | 6/2014 |

* cited by examiner

*Primary Examiner* — Patricia D Valenzuela
(74) *Attorney, Agent, or Firm* — CKC & Partners Co., LLC

(57) ABSTRACT

A heat spreading plate is suitable to be a top cover of a chip package structure. The heat spreading plate includes a main body and an isolating frame. The main body includes a plurality of metal sheets which are arranged spaced apart from one another totally and capable of thermally connecting different working chips mounted within the chip package structure, respectively. A gap is formed between any two neighboring ones of the metal sheets to completely separate them. The isolating frame surrounds the outer edges of the metal sheets and fills into the gaps for fixedly holding the metal sheets together. One surface of the isolating frame is formed with a plurality of hollow recesses, and each of the metal sheets is exposed outwards from one of the hollow recesses.

10 Claims, 7 Drawing Sheets

HEAT SPREADING PLATE

CROSS-REFERENCE TO RELATED APPLICATION

This application claims priority to Taiwan Application Serial Number 108141048, filed on Nov. 12, 2019, which is herein incorporated by reference.

BACKGROUND

Technical Field

The present disclosure relates to a heat spreading plate. More particularly, the present disclosure relates to a heat spreading plate of chip package structures.

Description of Related Art

With the development of the design concept of downsized semiconductor products, the volume of various semiconductor products (e.g., central processing unit, CPU or graphics processing unit, GPU, etc.) starts to be miniaturized, and the performance has been continuously enhanced so as to increase heat production. For example, a semiconductor product is a composite chip module that integrates multiple working chips to be encapsulated together for multiplexing functions.

However, the multiple working chips with different performances in the composite chip module will generate different amounts of heat. Therefore, heat dissipation means with different sizes or types are required to effectively dissipate the heat. In this way, if there is no decent heat dissipation method to eliminate the heat of the working chip, these excessively high temperatures will reduce the overall stability of the working chips and the product life. Therefore, how to discharge the heat to avoid overheating of the working chip is always not negligible problem.

SUMMARY

One aspect of the present disclosure is to provide a heat spreading plate to solve the aforementioned problems of the prior art.

In one embodiment of the disclosure, a heat spreading plate is suitable to be a top cover of a chip package structure. The heat spreading plate includes a main body and an isolating frame. The main body includes a plurality of metal sheets which are arranged spaced apart from one another totally, and capable of thermally connecting different working chips mounted within the chip package structure, respectively, wherein a gap is formed between any two neighboring ones of the metal sheets to completely separate the two neighboring ones of the metal sheets. The isolating frame surrounds outer edges of the metal sheets and fills into the gaps for fixedly holding the metal sheets together. One surface of the isolating frame is formed with a plurality of hollow recesses, and each of the metal sheets is exposed outwards from one of the hollow recesses.

According to one or more embodiments of the disclosure, in the foregoing heat spreading plate, the isolating frame is formed on the metal sheets by a plastic injection molding.

According to one or more embodiments of the disclosure, in the foregoing heat spreading plate, each of the metal sheets is located at a bottom of one of the hollow recesses.

According to one or more embodiments of the disclosure, the foregoing heat spreading plate further includes a reinforced frame. The reinforced frame is in a rectangular ring shape, and surrounds to form a frame opening. The reinforced frame is stacked on the surface of the isolating frame, and the frame opening overlaps the hollow recesses.

According to one or more embodiments of the disclosure, in the foregoing heat spreading plate, one of the metal sheets includes a first plate body and a three-dimensional structure, the three-dimensional structure is formed on one surface of the first plate body, and facing towards one of the hollow recesses for connecting one of the different working chips of the chip package structure.

According to one or more embodiments of the disclosure, in the foregoing heat spreading plate, the three-dimensional structure is a concave portion or a convex portion.

According to one or more embodiments of the disclosure, in the foregoing heat spreading plate, the outer edges of the metal sheets respectively are provided with protruding ribs.

According to one or more embodiments of the disclosure, in the foregoing heat spreading plate, another of the metal sheets includes a second plate body, wherein one surface of the second plate body is free with any concave portion, and flushed with the surface of the first plate body.

According to one or more embodiments of the disclosure, in the foregoing heat spreading plate, a material of each of the metal sheets and a material of the isolating frame are the same in thermal expansion coefficient.

According to one or more embodiments of the disclosure, in the foregoing heat spreading plate, the metal sheets are different in thickness.

According to one or more embodiments of the disclosure, in the foregoing heat spreading plate, each of the metal sheets further includes a block and a protective outer film completely covering the block.

Thus, through the structure of the above embodiments, the metal sheets with corresponding requirements are provided according to different demands in the disclosure. Thereby, not only effectively improving the heat dissipation performance, but also at least reducing the heat transfer from one of the metal sheets to the adjacent one of the metal sheets.

The above description is merely used for illustrating the problems to be resolved, the technical methods for resolving the problems and their efficacies, etc. The specific details of the present disclosure will be explained in the embodiments below and related drawings.

BRIEF DESCRIPTION OF THE DRAWINGS

The accompanying drawings are included to provide a further understanding of the present disclosure, and are incorporated in and constitute a part of this specification. The drawings illustrate embodiments of the disclosure and, together with the description, serve to explain the principles of the disclosure. In the drawings.

DETAILED DESCRIPTION

Figure 1:
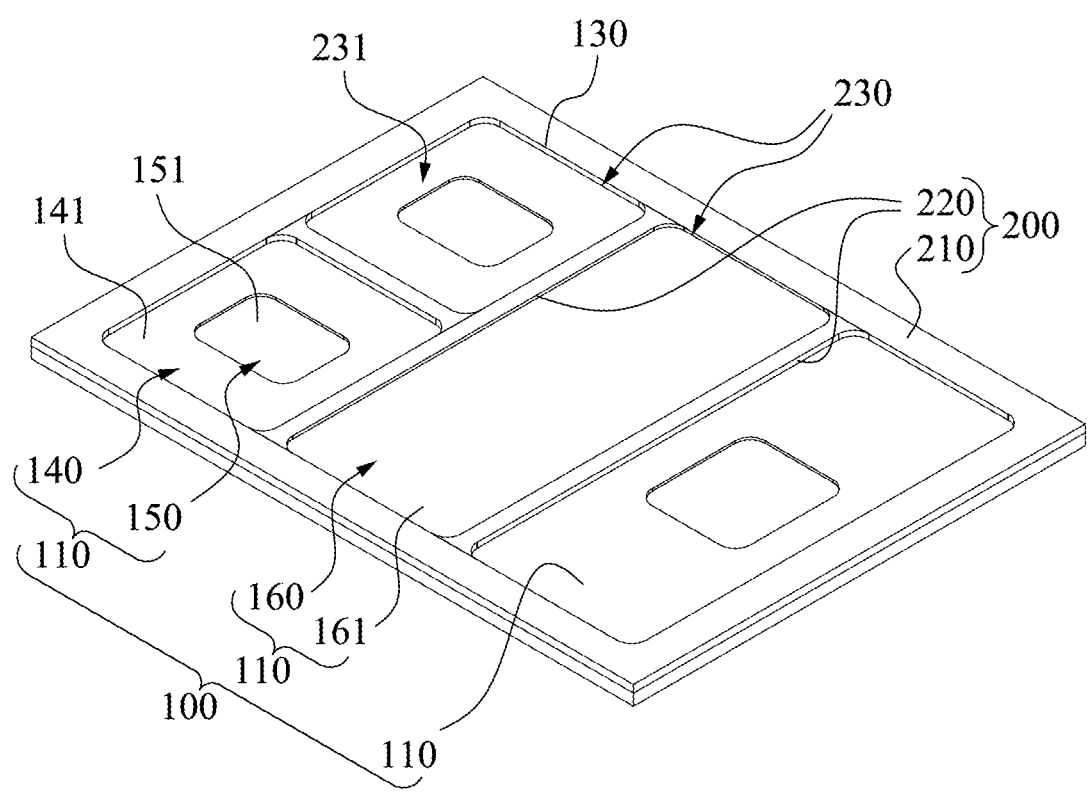
FIG. 1 is a perspective view of a heat spreading plate according to one embodiment of the present disclosure.

Reference will now be made in detail to the present embodiments of the present disclosure, examples of which are illustrated in the accompanying drawings. Wherever possible, the same reference numbers are used in the drawings and the description to refer to the same or like parts. According to the embodiments, it will be apparent to those skilled in the art that various modifications and variations can be made to the structure of the disclosure without departing from the scope or spirit of the disclosure.

Figure 2:
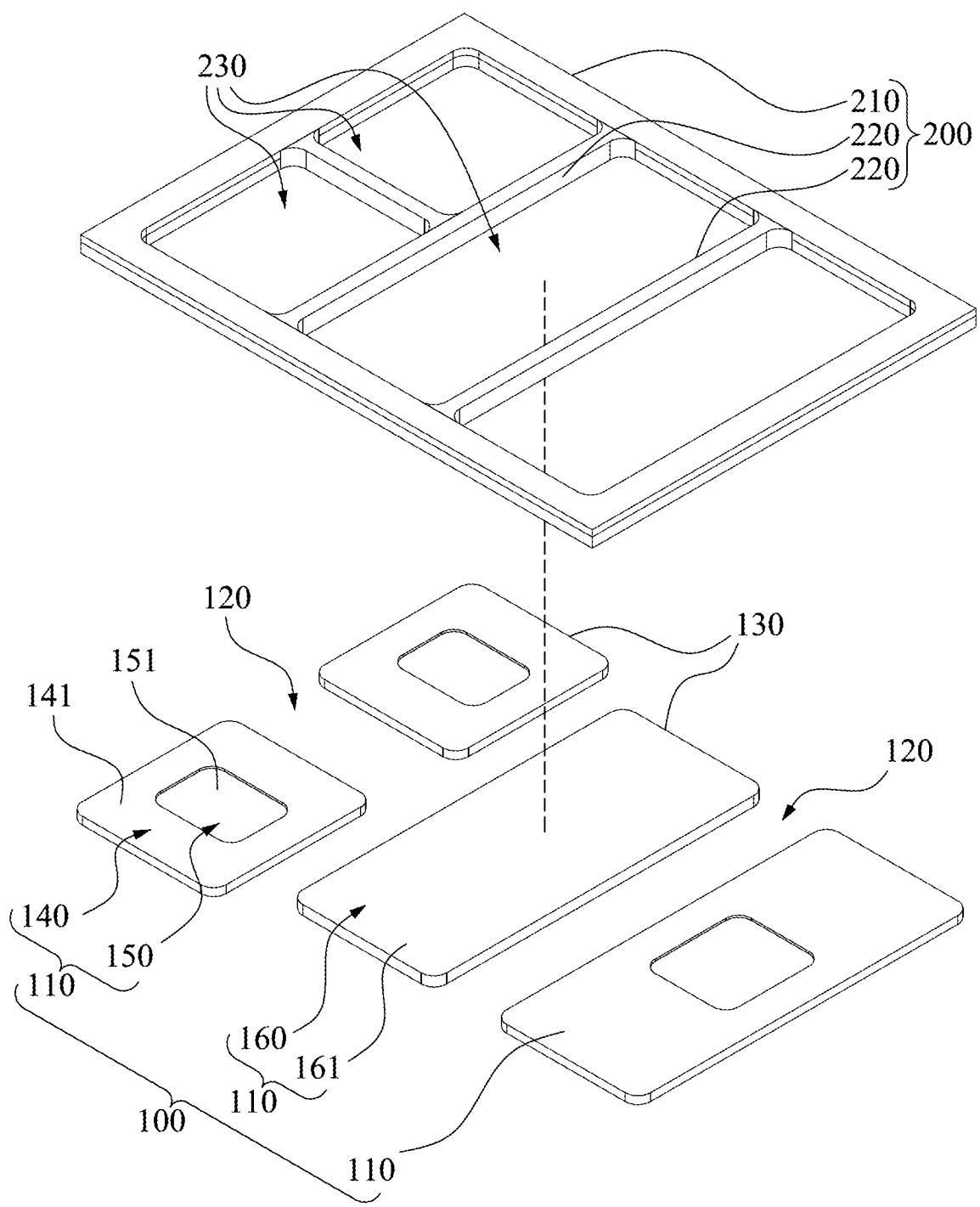
FIG. 2 is an exploded view of the heat spreading plate in FIG. 1.

Reference is now made to FIG. 1 to FIG. 2 in which FIG. 1 is a perspective view of a heat spreading plate 10 according to one embodiment of the present disclosure, and FIG. 2 is an exploded view of the heat spreading plate 10 in FIG. 1. As shown in FIG. 1 and FIG. 2, in one embodiment, the heat spreading plate 10 includes a main body 100 and an isolating frame 200. The main body 100 includes a plurality of metal sheets 110 which are arranged spaced apart from one another according to a flat placing arrangement. A gap 120 is formed between any two neighboring ones of the metal sheets 110. The isolating frame 200 surrounds the outer edges 130 of the metal sheets 110 and fills into the gaps 120 for fixedly holding the metal sheets 110 together. One surface of the isolating frame 200 is formed with a plurality of hollow recesses 230, and each of the metal sheets 110 is exposed outwards from one of the hollow recesses 230.

Figure 3:
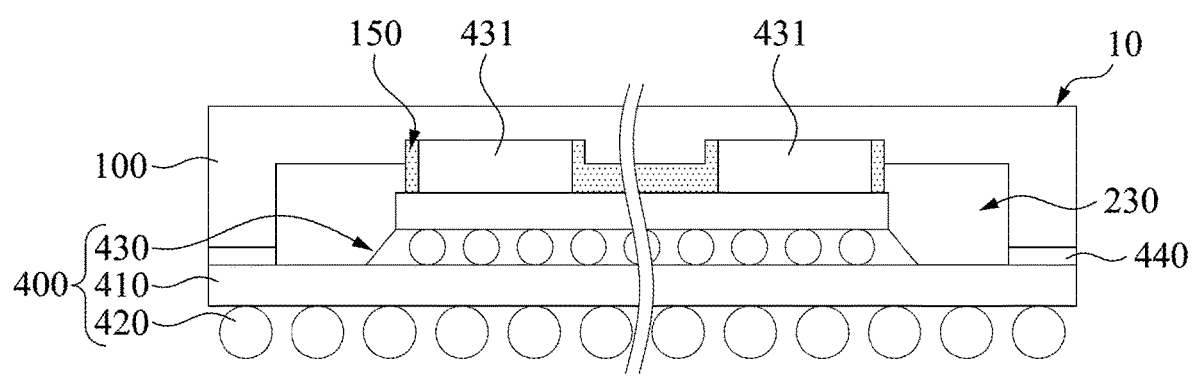
FIG. 3 is an operational view of the heat spreading plate in FIG. 1.

FIG. 3 is an operational view of the heat spreading plate 10 in FIG. 1. As shown in FIG. 1 and FIG. 3, in the embodiment, the heat spreading plate 10 can be a top cover of a chip package structure 400 in which the top cover can load heat pipes and fins (not shown in figures), or print patterns or text (not shown in figures). Therefore, the heat spreading plate 10 is used to protect the chip package structure 400 and conduct outwardly the heat of the chip package structure 400.

For example, the chip package structure 400 includes a substrate 410, a composite chip module 430 and a ball contact interface 420 (e.g., ball grid array, BGA). The composite chip module 430 and the ball contact interface 420 are respectively soldered on two opposite surfaces of the substrate 410. The composite chip module 430 includes a plurality of working chips 431. The composite chip module 430 includes a plurality of working chips 431. The working chips 431 with different performances will generate different amounts of heat. When the heat spreading plate 10 covers the chip package structure 400 and is adhered on the substrate 410 through the adhesive 440, the metal sheets 110 of the main body 100 can be thermally connected to the different working chips 431 of the composite chip module 430, respectively. Thus, the heat of the different working chips 431 is effectively dissipated.

Thus, through the structure of the above embodiment, the metal sheets 110 with corresponding requirements are provided according to different demands in the disclosure. Thereby, not only effectively improving the heat dissipation performance, but also at least reducing the heat transfer from one of the metal sheets 110 to the adjacent one of the metal sheets 110.

In the embodiment, the metal sheets 110 are arranged spaced apart from one another totally. In specific, the gap 120 formed between any two neighboring ones of the metal sheets 110 completely separates the neighboring ones of the metal sheets 110, and the gap 120 is physically separated by the isolating frame 200 completely.

In detail, the isolating frame 200 includes an external portion 210 and a plurality of inner portions 220. The external portion 210 is in a rectangular ring shape, and the inner portions 220 are arranged spaced in the external portion 210, and directly connected to the external portion 210. The external portion 210 covers the outer edges of the metal sheets 110, and the inner portions 220 are respectively filled within the gaps 120 so as to form the hollow recesses 230 which respectively expose the metal sheets 110 one by one. In other words, each of the metal sheets 110 is located at the bottom 231 of each of the hollow recesses 230.

Thus, heat may not, or at least not easily, be conducted from one to the adjacent one of the metal sheets 110, so that the heat dissipation of the corresponding working chip 431 might be affected. Therefore, since different working chips 431 may generate different amounts of heat, the thicknesses of these metal sheets 110 are also different to match different working chips 431, respectively. For example, the working chip 431 with higher power corresponds to a thicker one of the metal sheets 110. However, the disclosure is not limited thereto. In other embodiments, the thickness of the metal sheets 110 of the main body 100 may be the same one another according to different requirements and restrictions.

Furthermore, one part of the metal sheets 110 includes a first plate body 140 and a three-dimensional structure 150. The three-dimensional structure 150 is formed on one surface 141 of the first plate body 140, and facing towards one of the hollow recesses 230 for connecting one of the different working chips 431 of the chip package structure 400. The three-dimensional structure 150, for example, is a concave portion 151 for receiving and contacting a composite die of the working chip 431. Another part of the metal sheets 110 includes a second plate body 160. One surface 161 of the second plate body 160 is free with any three-dimensional structure 150 (e.g., the concave portion 151), and flushed with the surface 141 of the first plate body 140.

However, the disclosure is not limited thereto. In other embodiments, the three-dimensional structure may also be a convex portion according to different requirements and restrictions, or all of the metal sheets 110 described above have or do not have the three-dimensional structure.

In terms of production, firstly, each of the metal sheets 110 is formed by punching, next, the metal sheets 110 are respectively placed in a mold to be held together with plastic material by a plastic injection molding so as to form a heat spreading plate 10. It is noted, plastic material is resistant to high temperatures, and is with high bonding strength, and with similar thermal expansion coefficients, such as epoxy resins or others.

For example, the material of the aforementioned isolating frame 200 is usually with high strength, proper thermal expansion properties closing to that of the metal sheet 110. Also, the material of the aforementioned isolating frame 200 can withstand the high temperature of package reflow soldering, such as epoxy molding compound (EMC), silicone resin, liquid crystal polymer (LCP), PPA resin (polyphthalamide) or others.

In this embodiment, the isolating frame 200 is formed on the metal sheets 110 by a plastic injection molding, however, the disclosure is not limited thereto. The material of each of the metal sheets 110 and the material of the isolating frame 200 are the same, or substantially the same in thermal expansion coefficient. In this way, the possibility of the metal sheets 110 being separated from the isolating frame 200 is reduced.

In addition to metals with higher thermal conductivity, the metal sheet 110 can also be made of metals with high strength and high elastic modulus, such as titanium, iron, stainless steel, etc. The material of the metal sheets 110 is, for example, copper, aluminum, composite copper-tungsten, copper-molybdenum, or aluminum-based silicon carbide (AlSiC).

Figure 4:
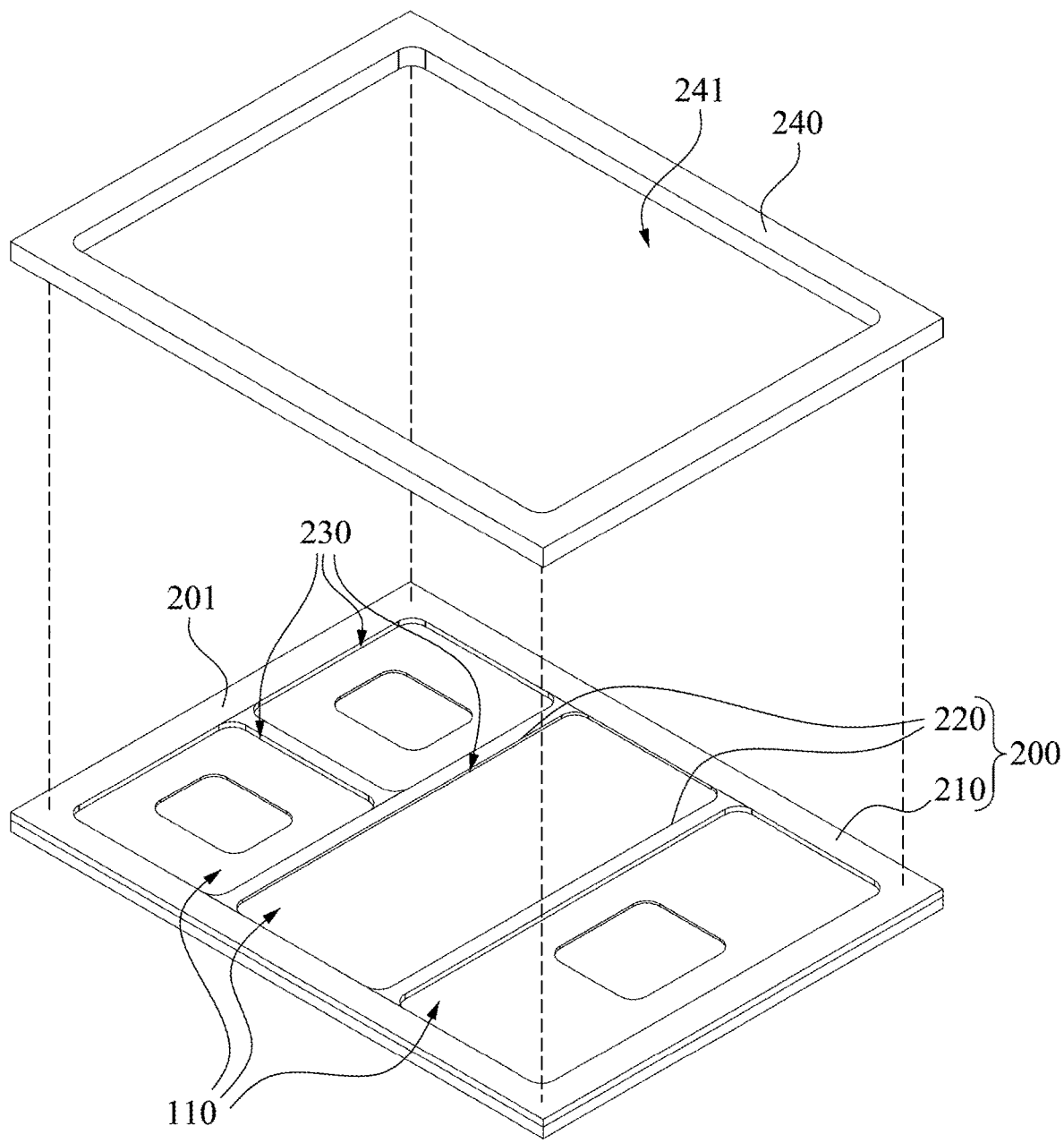
FIG. 4 is an exploded view of the heat spreading plate according to one embodiment of the present disclosure.

FIG. 4 is an exploded view of the heat spreading plate 11 according to one embodiment of the present disclosure. As shown in FIG. 2 and FIG. 4, the heat spreading plate 11 of the embodiment is substantially the same to the heat spreading plate 10 of FIG. 1, except that the heat spreading plate 11 further includes a reinforced frame 240. The reinforced frame 240 is in a rectangular ring shape, and stacked on the surface 201 of the isolating frame 200 having the hollow recesses 230. Furthermore, the reinforced frame 240 surrounds to form a frame opening 241 therein. The reinforced frame 240 is stacked on the surface 201 of the isolating frame 200, and the frame opening 241 overlaps the hollow recesses 230, in other words, the orthographic projection from the frame opening 241 to the surface 201 of the isolating frame 200 overlaps with all the above-mentioned hollow recesses 230 and the metal sheets 110.

More specifically, the external portion 210 of the isolating frame 200 and the reinforced frame 240 are the same in size. The reinforced frame 240 is fixed on the external portion 210 of the isolating frame 200.

Thus, refer to FIG. 3, when the heat spreading plate 11 of the embodiment is combined on the chip package structure 400, since the reinforced frame 240 surrounds the composite chip module 430 (not shown in the figure) of the chip package structure 400, it not only improves the side structural strength of the chip package structure 400, but further strengthen the sealing condition of the chip package structure 400.

Figure 5A:
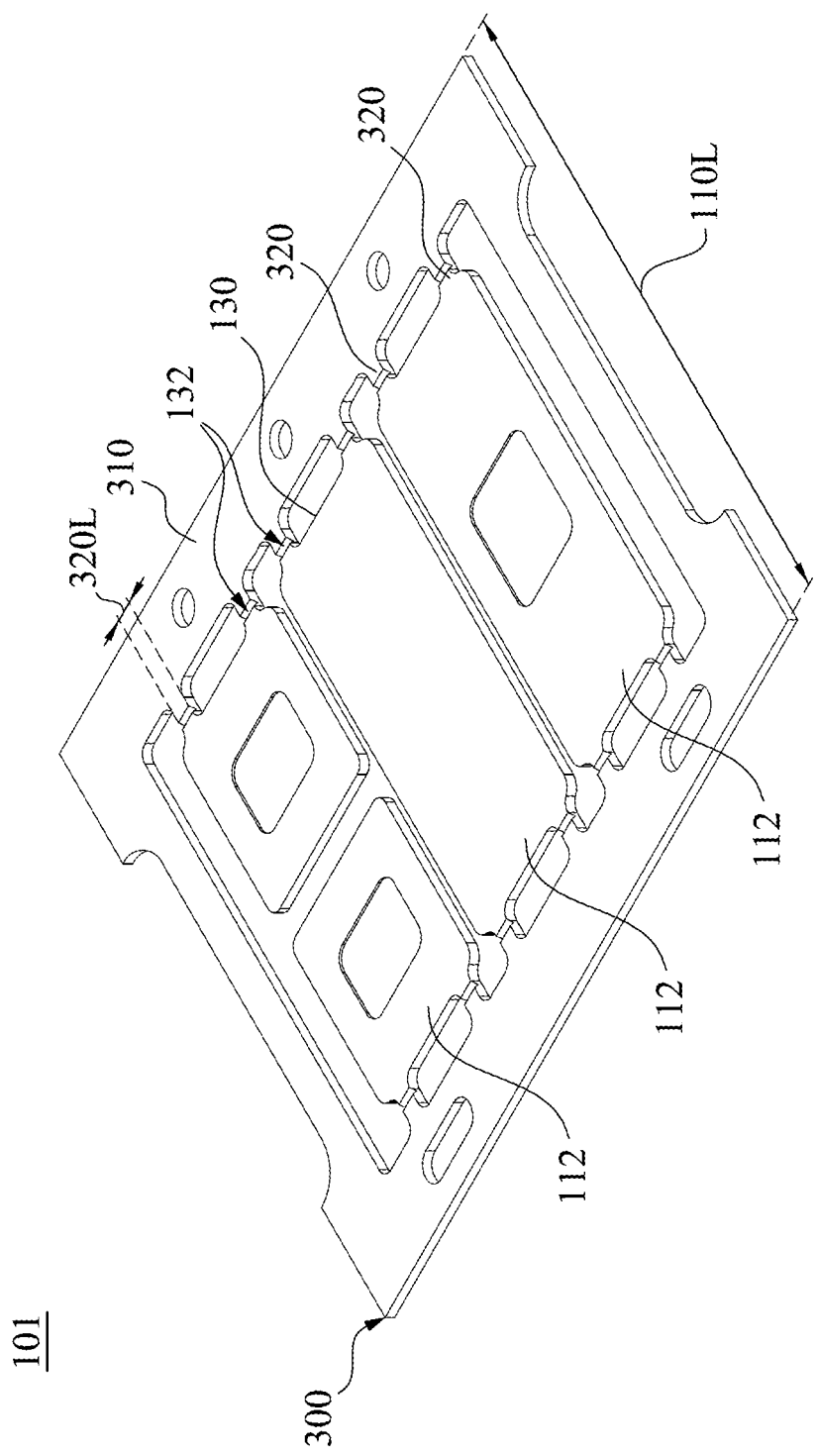
FIG. 5A is a perspective view of a main body of the heat spreading plate before being wrapped by an isolating frame according to one embodiment of the disclosure.

FIG. 5A is a perspective view of a main body 101 of the heat spreading plate 11 before wrapped by an isolating frame 200 according to one embodiment of the disclosure. As shown in FIG. 5A, in terms of production, a sheet material 300 is first stamped to present a plurality of metal sheets 112, a surrounding frame 310 and at least one connecting rib 320. The metal sheets 112 are respectively connected to the surrounding frame 310 through the connecting rib 320, and are surrounded by the surrounding frame 310. Thus, the metal sheets 112 can be respectively placed in a mold to be held together with plastic material by a plastic injection molding.

Finally, through the cutting marks 132 on each of the connecting ribs 320, the surrounding frame 310 can be cut to form the heat spreading plate 11 described in this embodiment.

Also, the length 320L of each of the connecting ribs 320 is not greater than 20% of the lateral length 110L of one side of the main body 102.

Figure 5B:
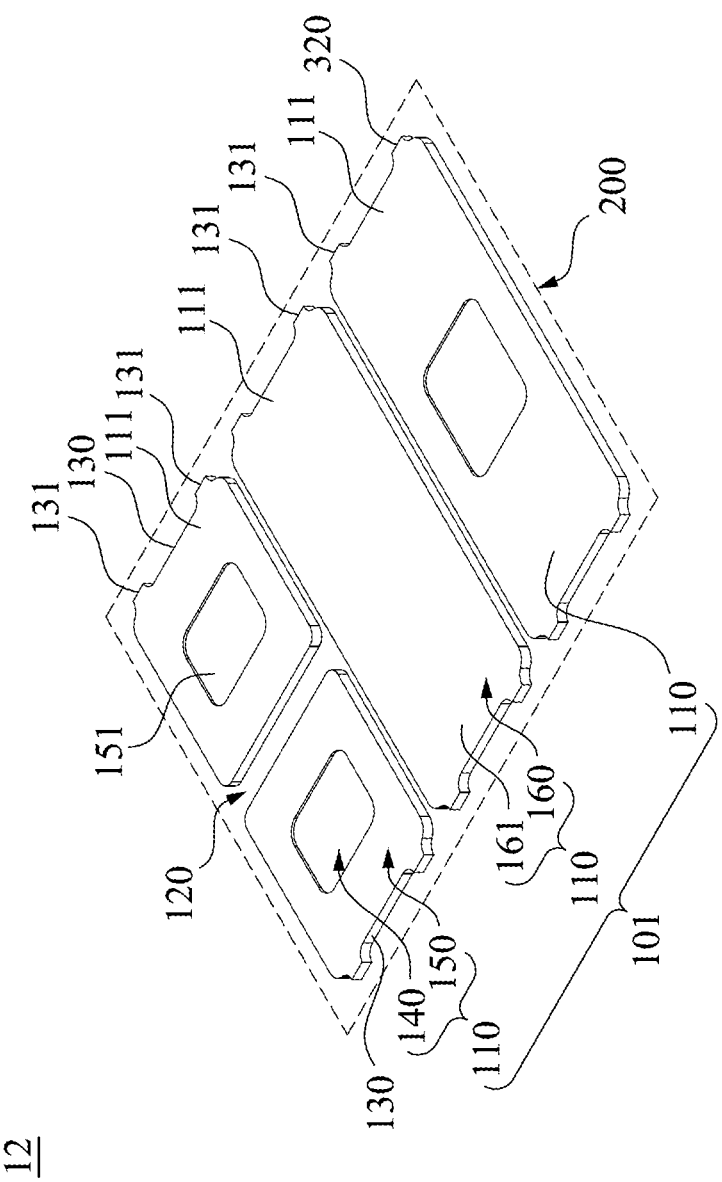
FIG. 5B is a schematic diagram of the heat spreading plate of FIG. 5A after being wrapped by the isolating frame and being cut.

FIG. 5B is a schematic diagram of the heat spreading plate 12 of FIG. 5A after being wrapped by the isolating frame and being cut. As shown in FIG. 5B, the outer edges 130 of the metal sheets 111 respectively are provided with at least one protruding rib 131. More specifically, any two adjacent ones of the metal sheets 111 respectively have two protruding ribs 131 at the outer edges 130 of the adjacent metal sheets facing away from the gap 120, and the protruding ribs 131 are spaced with each other. Two outer edges 130 of a single metal sheet 111 that are facing away from each other are provided with two protruding ribs 131. In this way, through the existence of the protruding ribs 131 of each of the metal sheets 111, the heat spreading plate 12 can be fixedly held by the isolating frame 200.

Figure 6:
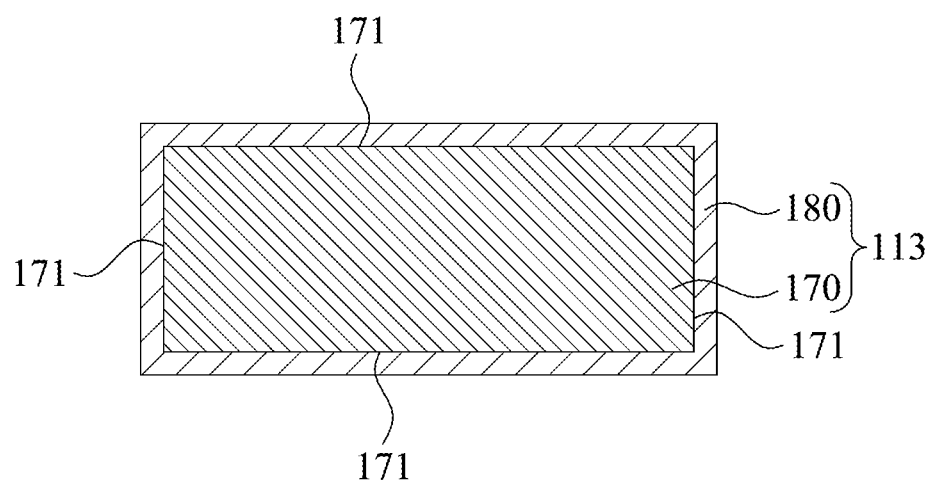
FIG. 6 is a cross-sectional view of one of metal sheets of a heat spreading plate according to one embodiment of the disclosure.

FIG. 6 is a cross-sectional view of a metal sheet 113 of a heat spreading plate according to one embodiment of the disclosure. As shown in FIG. 6, the metal sheet 113 of the heat spreading plate in the embodiment is substantially the same to the metal sheet 110 of FIG. 1, except that the metal sheet 113 usually undergoes surface treatment. More specifically, each of the metal sheets 113 further includes a block 170 and a protective outer film 180 completely covering the block 170. In other words, the protective outer film 180 covers all the outer side surfaces 171 of the block 170. The protective outer film 180 is, for example, a nickel or gold plating film or the like.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A heat spreading plate suitable to be a top cover of a chip package structure, and the heat spreading plate comprising:
   a main body comprising a plurality of metal sheets which are arranged spaced apart from one another totally, and capable of thermally connecting different working chips mounted within the chip package structure, respectively, wherein a gap is formed between any two neighboring ones of the metal sheets to completely separate the two neighboring ones of the metal sheets, and one of the metal sheets comprising a first plate body and a three-dimensional structure; and
   an isolating frame surrounding outer edges of the metal sheets and filling into the gaps for fixedly holding the metal sheets together,
   wherein one surface of the isolating frame is formed with a plurality of hollow recesses, and each of the metal sheets is exposed outwards from one of the hollow recesses, and the three-dimensional structure is formed on one surface of the first plate body, and facing towards one of the hollow recesses for connecting one of the different working chips of the chip package structure.

2. The heat spreading plate of claim 1, wherein the isolating frame is formed on the metal sheets by a plastic injection molding.

3. The heat spreading plate of claim 1, wherein each of the metal sheets is located at a bottom of one of the hollow recesses.

4. The heat spreading plate of claim 1, further comprising:
   a reinforced frame being in a rectangular ring shape, and surrounding to form a frame opening, wherein the reinforced frame is stacked on the surface of the isolating frame, and the frame opening overlaps the hollow recesses.

5. The heat spreading plate of claim 1, wherein the three-dimensional structure is a concave portion or a convex portion.

6. The heat spreading plate of claim 1, wherein the outer edges of the metal sheets respectively are provided with protruding ribs.

7. The heat spreading plate of claim 1, wherein another of the metal sheets comprises a second plate body, wherein one surface of the second plate body is free with any concave portion, and flushed with the surface of the first plate body.

8. The heat spreading plate of claim 1, wherein a material of each of the metal sheets and a material of the isolating frame are the same in thermal expansion coefficient.

9. The heat spreading plate of claim 1, wherein the metal sheets are different in thickness.

10. The heat spreading plate of claim 1, wherein each of the metal sheets further comprises a block and a protective outer film completely covering the block.

* * * * *